US007462500B2

(12) United States Patent
Terui

(10) Patent No.: US 7,462,500 B2
(45) Date of Patent: Dec. 9, 2008

(54) MANUFACTURING METHOD OF INK JET RECORDING HEAD AND INK JET RECORDING HEAD MANUFACTURED BY MANUFACTURING METHOD

(75) Inventor: Makoto Terui, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 321 days.

(21) Appl. No.: 11/007,322

(22) Filed: Dec. 9, 2004

(65) Prior Publication Data

US 2005/0140716 A1 Jun. 30, 2005

(30) Foreign Application Priority Data

Dec. 26, 2003 (JP) ............................. 2003-434523
Nov. 15, 2004 (JP) ............................. 2004-330630

(51) Int. Cl.
*H01L 21/00* (2006.01)

(52) U.S. Cl. .......................... 438/21; 29/25.35; 29/611; 29/846; 216/27; 216/34; 216/56; 347/44; 347/45; 347/70

(58) Field of Classification Search ................ 29/25.35; 216/27; 347/44
See application file for complete search history.

(56) References Cited

U.S. PATENT DOCUMENTS

| | | | |
|---|---|---|---|
| 5,458,254 A | 10/1995 | Miyagawa et al. | |
| 5,945,260 A * | 8/1999 | Miyagawa et al. | 430/320 |
| 6,141,615 A * | 10/2000 | Saito et al. | 701/51 |
| 6,484,399 B2 * | 11/2002 | Aono et al. | 29/890.1 |
| 2004/0119789 A1 * | 6/2004 | Usami et al. | 347/63 |
| 2004/0174407 A1 | 9/2004 | Hayakawa et al. | |
| 2004/0238485 A1 | 12/2004 | Hayakawa et al. | |
| 2005/0140737 A1 | 6/2005 | Ushijima et al. | |

FOREIGN PATENT DOCUMENTS

JP 5-330066 A 12/1993

* cited by examiner

*Primary Examiner*—Binh X Tran
*Assistant Examiner*—Maki Angadi
(74) *Attorney, Agent, or Firm*—Fitzpatrick, Cella, Harper & Scinto

(57) ABSTRACT

A manufacturing method of an ink jet recording head including a discharge port for discharging ink includes the step of forming the discharge port by performing dry etching of a discharge port forming member for forming the discharge port, wherein the discharge port forming member is formed of a Si including resin, and the step of dry etching is performed by using an etching gas including oxygen and chlorine as necessary components.

8 Claims, 4 Drawing Sheets

MANUFACTURING METHOD OF INK JET RECORDING HEAD AND INK JET RECORDING HEAD MANUFACTURED BY MANUFACTURING METHOD

BACKGROUND OF THE INVENTION

1. Field of the Invention

The present invention relates to a manufacturing method of an ink jet recording head, and to an ink jet recording head manufactured by the manufacturing method. In particular, the present invention relates to a manufacturing method of an ink jet recording head equipped with an orifice plate made of a resin including silicon, and to an ink jet recording head manufactured by the manufacturing method.

2. Related Background Art

An ink jet recording head applied to an ink jet printing system is generally equipped with a discharge port (orifice) of a fine liquid (ink), a liquid flow path and a liquid (ink) discharge pressure generation portion formed in a part of the liquid flow path.

Various methods have conventionally been proposed as a method for producing such an ink jet recording head as a fine structure like this.

Among them, there is a method which the present assignee has disclosed in Japanese Patent Application Laid-Open No. H05-330066. In the method, a resin has been formed as a shape member at a position where a nozzle flow path is formed on a substrate, and a resin which is not dissolved by the shape member is coated on the resin as the shape member. Then, the coated resin is cured. Furthermore, a nozzle pattern is formed on the surface of the insoluble resin (i.e. a nozzle constituting member) opposed to a material to be printed by means of a resin having a high oxygen plasma resistance property, and the nozzle constituting member is etched by the method of dry etching by the oxygen plasma by using the nozzle pattern as a mask to form a nozzle.

The above-mentioned method has advantages that the method does not need any cutting process of the surface of the orifice, and that the method does not need any adhesion by means of an adhesive, and further that the method can easily control the length of an ink flow path and the length of the orifice portion. The selectivity of materials is also wide in the method, and consequently the method is superior one in utility.

Now, in an ink jet recording head, there is the case where tantalum (Ta) or the like is used as a protective film for protecting a heating resistor provided on the surface of a substrate. For further improving the adhesion property to the substrate to which such a protective film is formed, a silane coupling agent or the like is sometimes mixed into the resin of the nozzle constituting member in consideration of an ink resistance property.

Accordingly, when the above-mentioned method was implemented by adopting a resin including silicon as the nozzle constituting member, columnar dregs were found. The columnar dregs easily remained by adhering to the wall of a flow path or the edge portion of a discharge port at the time of the removal of the shape member. The columnar dregs hinder the flow of ink in the flow path or make the discharge direction of the ink at the discharge port unstable at the time of discharging the ink. In particular, the diameter of the discharge port of a recording head has recently been required to be smaller (within a range from several to several tens μm) for realizing the improvement of picture quality. Consequently, it is apprehended that the adoption of the above-mentioned manufacturing method to such a recording head would exert an undesired influence upon the yield of products.

SUMMARY OF THE INVENTION

In view of the problem, the present invention can provide a manufacturing method of an ink jet recording head in which the discharge of ink droplets is stable, and an ink jet recording head manufactured by the manufacturing method.

To solve the problem, the manufacturing method of an ink jet recording head of the present invention is a manufacturing method of an ink jet recording head including a discharge port for discharging ink, the method including the step of forming the discharge port by performing dry etching of a discharge port forming member for forming the discharge port, wherein the discharge port forming member is formed of a Si including resin, and the step of dry etching is performed by using an etching gas including oxygen and chlorine as necessary components.

According to the present invention, the following effects can be obtained by means of the above-mentioned configuration. That is to say, a plasma composed of a mixed gas of oxygen and chlorine is used for forming a discharge port in a liquid flow path constituting member by dry etching, which makes it possible to form a discharge port having no columnar dregs therein. As a result, an ink jet recording head superior in the discharge stability of droplet ink can be obtained at a high yield.

DETAILED DESCRIPTION OF THE PREFERRED EMBODIMENTS

Figure 1A:
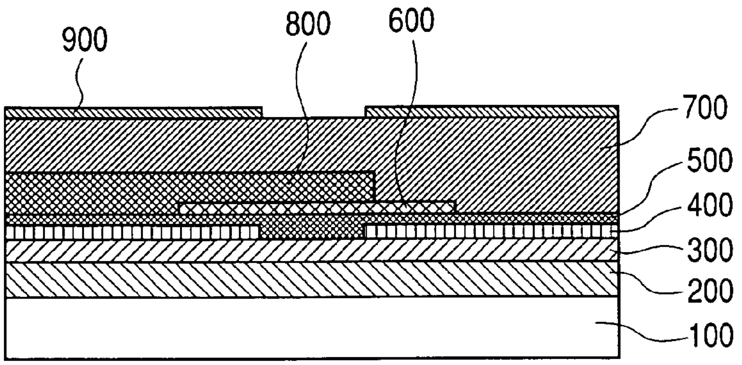
FIGS. 1A, 1B, 1C and 1D are sectional views showing the processes of an embodiment of the manufacturing method of an ink jet recording head of the present invention.

Referring to the attached drawings, the present invention is described in detail in the following.

The present inventor found that the addition of chlorine besides oxygen at the time of the dry etching of a resin layer as a liquid flow path constituting member (hereinafter simply referred to as a liquid flow path constituting layer) could solve the problem of the generation of irregularities in the shape of a stripe on the side wall of a nozzle as a liquid discharge port, and the problem of the generation of columnar dregs.

In case of using the plasma of the chemical element of a chlorine gas, the resistance property of Si including resist does not exist, and the resistance property cannot be used. Accordingly, a metal film or the like is formed on a liquid flow path constituting layer, and furthermore a resist pattern is formed on the metal film. After that, the metal film is patterned, and the resist is peeled off. Then, the procedure moves to a discharge port dry etching process using the patterned metal film as a mask. The procedure is very troublesome in processes. Moreover, the step of forming the metal film or the like on the resin with a strong adhesion force must be very unstable.

On the contrary, because the dry etching using the plasma of mixed gas of oxygen and chlorine could maintain the resistance property of the Si including resist to the plasma, the procedure is easy in processes and the dry etching is very stable. The maximum advantage is that it is difficult to generate the dregs, which is found in case of using oxygen plasma, i.e. the columnar dregs caused by an element added to improved the ink resistance property.

Moreover, there is the case where an etching rate becomes higher when a helium gas, an argon gas, a nitrogen gas, a carbon monoxide gas, a fluorine series gas, a chlorine series gas, or the like is used in addition to the chlorine gas as the gas to be mixed to the oxygen in some structures of the resin of the liquid flow path constituting layer. Accordingly, these gasses may be further mixed.

Moreover, in the dry etching, it is possible to realize an ink jet recording head dischargeable droplet ink stably by adopting a dry etching process having a high anisotropy to form the side wall of the discharge port in the shape perpendicular to a face surface.

Incidentally, as a plasma source used for a dry etcher, it is possible to use a capacity-coupled type plasma, an electron cyclotron resonance (ECR) plasma, a helicon wave plasma, an induce-coupled type plasma, a surface wave plasma and the like, and then it becomes possible to form a discharge port having a shape suitable for discharging droplet ink by adopting the above-mentioned plasma.

The shape of the discharge port and the etching rate in this case are naturally different according to the kind of the gas, but can be controlled by a processing pressure, a making bias to a substrate, making power to a plasma source, a positional relationship between the plasma and the substrate, the temperature of the substrate, etching time and the like.

After performing the dry etching processing mentioned above, the Si including resist, the surface layer of which has changed to be $SiO_2$, is peeled off. In this case, after the removal of the $SiO_2$ formed on the surface of the Si including resist pattern by using dilute fluorinated acid or the like, the Si including resist can be peeled off by using a general peeling liquid to be used at the time of the removal of a positive resist, namely a peeling liquid having the principal components of diethylene glycol monobutyl ether and ethylene glycol, a peeling liquid having the principal components of monoethanolamine and dimethyl sulfoxide (DMSO), a peeling liquid having the principal components of N-methyl-2-pyrrolidone and DMSO, or the like.

At this time, the peeling can be performed only by the processing of dipping, but the peeling operation can be terminated more rapidly by using an ultrasound wave combinedly at the time of dipping. The frequency of the ultrasound wave can be suitably selected. For example, 36,100, 200 kHz or the like can be used.

Moreover, as a more preferable form, it is preferable to previously remove the liquid flow path constituting layer coated on the periphery of the wafer where no electrode pads, no cutting lines and no chip patterns exist for suppressing the dispersion of the area of the discharge port owing to the effect of micro-loading. That is to say, after the removal of the parts other than the discharge port, the Si including resist is coated, and the patterning of a discharge port pattern is performed.

Showing examples, the present invention is further described in detail in the following.

EXAMPLE 1

FIGS. 1A to 1D show sectional views of the processes of an embodiment of an ink jet recording head of the present invention.

Among the FIGS. 1A to 1D, FIG. 1A shows a state in which resist to be a shape member (a liquid flow path pattern) 800 is coated on a substrate 100 having a heating resistor to be patterned before a photosensitive epoxy resin to be a liquid flow path constituting member 700 is coated to be cured, and then a Si including resist 900 is patterned on the epoxy resin.

Figure 1B:
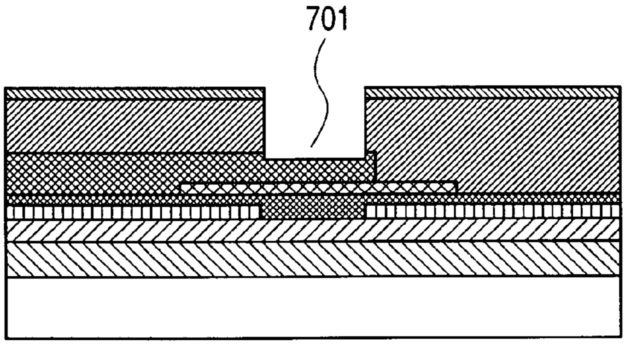

FIG. 1B shows a state in which the epoxy resin to be the liquid flow path constituting member 700 is etched by the method of dry etching by the plasma of a mixed gas of oxygen and chlorine by using the Si including resist 900 as a mask.

Figure 1C:
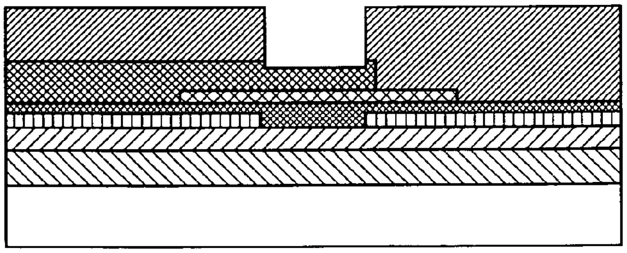

FIG. 1C shows a state in which the Si including resist 900 is peeled off.

Figure 1D:
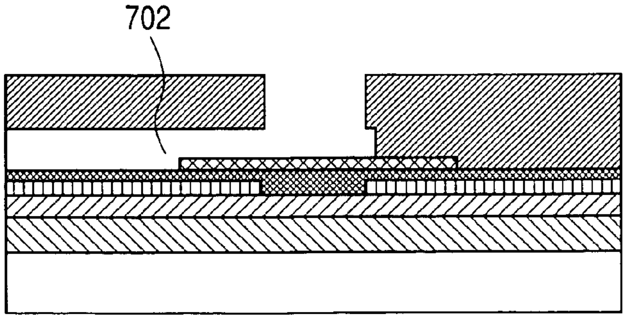

FIG. 1D shows a state in which the resist to be the shape member (the liquid flow path pattern) 800 has been removed.

In FIGS. 1A to 1D, the substrate 100 including the heating resistor was made as follows. That is to say, a $SiO_2$ film having a thickness of 2.5 μm was formed on a Si wafer having a thickness of 5 inches by thermal oxidation. The $SiO_2$ film was used as a thermal storage layer 200. A $HfB_2$ layer was formed to be a thickness of 0.15 μm as a heating resistor layer 300 on the substrate by sputtering. Successively, a Ti layer was deposited to be a thickness of 0.005 μm (not shown) and an Al layer was continuously deposited to be a thickness of 0.5 μm by electron-beam evaporation. The deposited Ti layer and Al layer were used for an electrode 400. A pattern as shown in FIG. 1A was formed by a photolithography process. In the figure, the sizes of a heater were 30 μm in width and 150 μm in length. The resistance of the heater including the resistance of the Al electrode was 150 Ω.

Next, a $SiO_2$ layer was deposited on the whole surface of the substrate to be a thickness of 2.2 μm by sputtering, and the deposited $SiO_2$ layer was used as a protection film 500. Successively, a second protection film 600 of Ta having a thickness of 0.5 μm was deposited on the whole surface of the protection film 500 by sputtering.

Next, polymethyl isopropenyl ketone (ODUR-1010 made by Tokyo Ohka Kogyo Co., Ltd.) was spin coated on the substrate as the soluble shape member (the liquid flow path pattern) 800, and the coated polymethyl isopropenyl ketone was pre-baked for four minutes at 120° C. After that, the pattern exposure of the liquid flow path was performed by means of a mask aligner PLA520 (cold mirror CM290) made by Canon Inc. The exposure was performed for 1.5 minutes. The development was performed for 1.5 minutes. The development was performed by using a mixture of methyl isopropyl ketone and xylene at the rate of 2 to 1. Xylene was used for a rinse. The liquid flow path pattern formed of the soluble resin was for securing a liquid flow path between an ink supply port and an electrothermal conversion element. Incidentally, the film thickness of the resist after the development was 10 μm.

Next, the resin compositions shown in Table 1 were dissolved into a mixed solvent of methyl isobutyl ketone and xylene at the density of 50 weight percent, and the liquid flow path constituting member 700 was formed by spin coat. The film thickness of the liquid flow path constituting member 700 on the shape member (the liquid flow path pattern) 800 was 10 μm. The mechanical strength of the liquid flow path constituting member, the adhesion property thereof to the substrate, and the like were further improved by combining a photo cationic polymerization starting agent and a reducing agent.

TABLE 1

| COMPOSITION OF LIQUID FLOW PATH CONSTITUTING RESIN | | COMPOUND RATIO (PART BY WEIGHT) |
|---|---|---|
| EPOXY RESIN | POLYFUNCTIONAL EPOXY RESIN OF OXYCYCLOHEXANE SKELETON EHPE-3150 (MADE BY DAICEL CHEMICAL INDUSTRIES LTD.) | 100.0 |
| PHOTO CATIONIC POLYMERIZATION STARTING AGENT | 4,4'-DI-t-BUTYLPHENYL IODONIUM HEXAFLUORO ANTIMONATE | 0.5 |
| REDUCING AGENT | COPPER TRIFLATE | 0.5 |
| SILANE COUPLING AGENT | A-187 (MADE BY NIPPON UNICAR CO., LTD.) | 5.0 |

Next, a pattern exposure for removing the liquid flow constituting paths at an electrode pad (not shown), at cutting lines (not shown), and at the periphery of the wafer where no patterns were formed was performed by means of the mask aligner PLA520 (the cold mirror CM290). Incidentally, the exposure was performed for five seconds, and after-bake was performed at 60° C. for ten minutes. Because the photo cationic polymerization starting agent and the reducing agent (copper triflate) did not substantially react with each other under these conditions, the patterning using light could be performed.

Next, development was performed by using methyl isobutyl ketone.

After that, the Si including resist 900 was coated on the liquid flow path constituting member 700 to be 2 μm in thickness also by the spin coat method, and was pre-baked at 90° C. Then, the baked Si including resist 900 was irradiated by ultraviolet (UV) light by the light exposure of 500 mJ/cm$^2$. Last, the rocking dipping of the substrate was performed for one minute in a tetramethyl ammonium hydroxide (TMAH) series developing solution to perform the development thereof. After a rinse was performed for twenty seconds by using pure water, the liquid flow path constituting member 700 was dried up by $N_2$ blow.

After that, the substrate was thrown into a dry etcher using electron cyclotron resonance (ECR) plasma as a plasma source to perform the dry etching of the liquid flow path constituting member 700. At this time, the etching conditions were as follows. That is to say, oxygen and chlorine were used as the etching gas. The flow rates of the oxygen and the chlorine were 50 sccm and 50 sccm, respectively. The pressure was 5 mTorr. A radio frequency (RF) bias to be applied to the substrate was 30 W. In addition, a microwave and a coil current were set for the stable discharge of the ECR plasma. Moreover, for preventing the change in quality of the shape member (the liquid flow path pattern) to lower the removal performance thereof, and the deformation of the liquid flow path constituting member owing to the generation of a gas from the shape member (the liquid flow path pattern) during these processes, which were caused by the exposure of the substrate to the high temperature of the plasma, the wafer was stuck to a wafer stage by the electrostatic absorption of the wafer, and the stuck wafer was cooled to a temperature of 30°C.

After the epoxy resin of the liquid flow path constituting member had been etched under such conditions, the shape of the nozzle (the discharge port 701), which had been etched, was observed with a scanning electron microscope (SEM). Then, the following observation results were obtained. Because the anisotropy of the etching was strong, the size of the Si including resist pattern and the size of the discharge port were almost the same, and there were no stripe-shaped irregularities on the side wall of etching, i.e. on the side wall of the discharge port. The side wall of the discharge port was perpendicular to the face surface, and there was no generation of the columnar dregs on the shape material (the liquid flow path pattern). The state is shown in FIG. 1B.

After that, the substrate was dipped in the buffered fluorinated acid composed of hydrogen fluoride and ammonium fluoride in the weight ratio of 1 to 7 for 30 seconds. After that, the Si including resist was peeled off in a peeling liquid composed of diethylene glycol monobutyl ether and ethylene glycol monobutyl ether (e.g. 1112A made by Shipley Company LLC) by the application of an ultrasonic wave for 90 seconds. The state is shown in FIG. 1C. Incidentally, the surface of the shape member (the liquid flow path pattern) 800 at the bottom end of the discharge port was slightly etched owing to the over etching at the time of the etching of the liquid flow path constituting member 700.

After that, the substrate was exposed for two minutes with the mask aligner PLA520 (the cold mirror CM290) again for two minutes, and the substrate was dipped in the methyl isobutyl ketone solution while an ultrasonic wave was applied thereto to elute the remaining shape member (the liquid flow path pattern) 800. Thus, a liquid flow path 702 was formed.

Next, the ink jet recording head was heated for one hour at 150° C. to cure the liquid flow path constituting member completely. At this step, the photo cationic polymerization starting agent and the copper triflate reacted with each other to accelerate the cationic polymerization of the epoxy resin. The thus obtained cured material of the epoxy resin had a higher crosslink density in comparison with that of the cured material cured only by light, and was superior in mechanical strength, in adhesion property to the substrate and in ink resistance property.

Last, the wafer was cut into a state of chips. When the state was observed with the SEM, the discharge port was a rectangle as shown in FIG. 1D. No burrs as were seen at the time of forming the discharge port with a laser were observed on the upper surface and the lower surface of the discharge port.

For performing a discharge test, the substrate forming the discharge port shown in FIG. 1D therein was connected with a container storing discharging ink, i.e. the ink including pure water, diethylene glycol, isopropyl alcohol, lithium acetate and black dye food black 2 at a ratio of 79.4, 15, 3, 0.1 and 2.5, with a tube put between them. When a rectangular voltage having a peak voltage of 30 V and a frequency of 3 kHz was applied to the electrothermal conversion body for 10 μs, liquid was discharged from the orifice according to the applied signal, and flying droplets were stably formed.

Moreover, the dispersion of the areas of the discharge ports in the wafer was very small, and the dispersion of the amounts of ink discharge was also very small. Consequently, there were no problems for forming an image.

Moreover, after the ink jet recording head had been held at 60° C. for three months with the ink being filled therein, printing was again performed. Then, a printed material similar to that before the preservation test could be obtained.

EXAMPLE 2

A discharge port was formed under the same conditions as those of Example 1. Incidentally, the liquid flow constituting members on an electrode pad, on a cutting line, and on the periphery of the wafer where no patterns were formed were removed not by the exposure and development process, but by dry etching similar to that of the discharge port.

For performing a discharge test, the substrate, in which the discharge port had been thus formed (in the same state as that shown in FIG. 1D), was connected to a container storing the discharging ink, i.e. the ink including pure water, diethylene glycol, isopropyl alcohol, lithium acetate and black dye food black 2 at a ratio of 79.4, 15, 3, 0.1 and 2.5, with a tube put between them. When a rectangular voltage having a peak voltage of 30 V and a frequency of 3 kHz was applied to the electrothermal conversion body for 10 μs, liquid was discharged from the orifice according to the applied signal, and flying droplets were stably formed.

However, on the other hand, the dispersion of the areas of the discharge ports in the wafer was large, and the dispersion of the amounts of ink discharge was also very large. Consequently, there was a stripe in an image formed by a discharge port through which the amount of ink discharge was small. And, no high quality images could be obtained in comparison with Example 1.

However, because the influence of micro loading also varies greatly according to the shape of a pattern, an etching condition and an etching apparatus, it is considered that similar effects to those of Example 1 could be obtained when the influence of the micro loading is at a negligible level.

EXAMPLE 3

A discharge port was formed by changing the resin of the flow path constituting member as follows from that of Example 2. That is to say, a copolymer of glycidyl methacrylate and methyl methacrylate at a rate of 20 to 80 was used. A material produced by mixing 94% of the resin, 2% of triethylenetetramine as a curing agent and 4% of A-187 (trade name) made by Nippon Unicar Co., Ltd. was dissolved in chlorobenzene at the density of 20 wt % to be used. The resin was coated by a spinner, and the resin was baked at 80° C. for two hours as it was to be cured.

For performing a discharge test, the substrate, in which the discharge port had been thus formed (in the same state as that shown in FIG. 1D), was connected to a container storing the discharging ink, i.e. the ink including pure water, diethylene glycol, isopropyl alcohol, lithium acetate and black dye food black 2 at a ratio of 79.4, 15, 3, 0.1 and 2.5, with a tube put between them. When a rectangular voltage having a peak voltage of 30 V and a frequency of 3 kHz was applied to the electrothermal conversion body for 10 μs, liquid was discharged from the orifice according to the applied signal, and flying droplets were stably formed.

Figure 4:
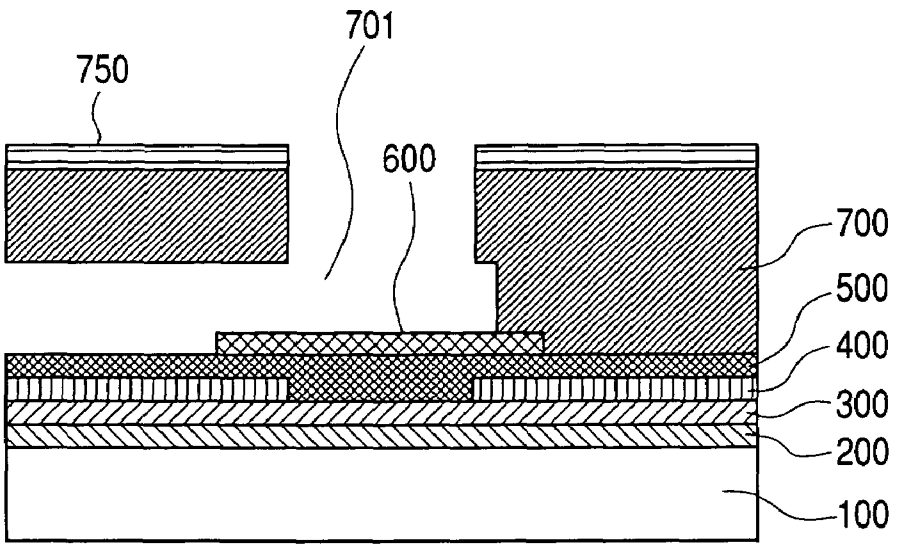
FIG. 4 is a sectional view of an embodiment of an ink jet recording head of the present invention.
Figure 5:
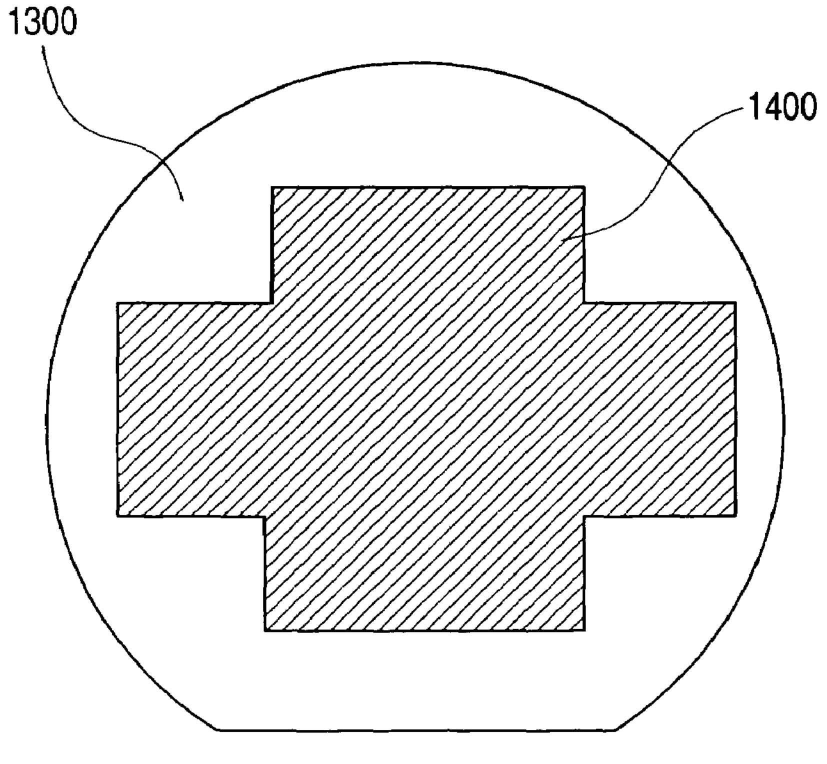
FIG. 5 is a schematic diagram showing the position of the periphery of a wafer without any mask pattern in the wafer.

Incidentally, there is a case where a water repellant layer 750 is formed on the liquid flow path constituting member 700 to cover the discharge port surface as shown in FIG. 4 in each example described above (that is to say, the liquid flow path constituting member 700 and the water repellent layer 750 are provided as the discharge port forming member). The water repellent agent to be used for such a water repellent layer includes fluorine or silicon. Hereupon, when the water repellent agent including silicon is used as the water repellent layer 750, generally the content of Si in the resin is more than that in the liquid flow path constituting member 700.

Accordingly, in the case where the ink jet recording head as shown in FIG. 4 is formed in accordance with the present invention, the ratio of gasses is changed according to layers in order that the ratio of chlorine to oxygen in the dry etching of the water repellent layer may be higher than the ratio of chlorine to oxygen in the dry etching of the liquid flow path constituting member. Thereby, the generation of the columnar dregs can be suppressed at the etching of the water repellent layer, and the etching rate of the liquid flow path constituting member, which is relatively thinner than the water repellent layer, can be heightened. This fact is desirable for the effective manufacturing of the ink jet recording head.

COMPARATIVE EXAMPLE 1

Figure 2A:
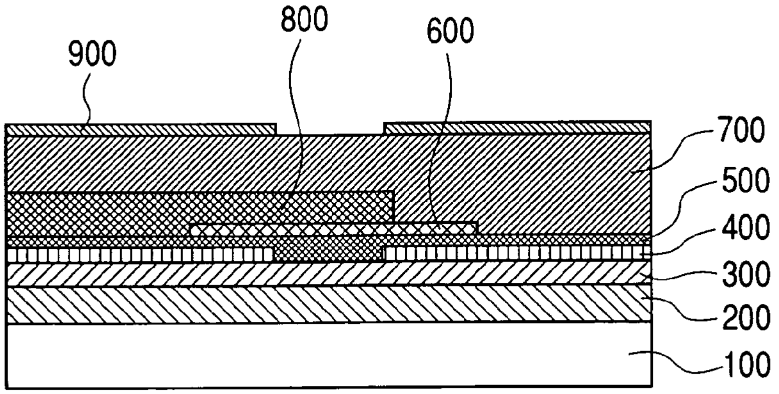
FIGS. 2A, 2B, 2C and 2D are sectional views showing the processes of a manufacturing method in case of forming the discharge port of an ink jet recording head by using oxygen plasma.

As shown in FIG. 2A, the processes from the formation of the liquid flow path constituting member 700 on the substrate 100 to the formation of the mask pattern of the Si including resist 900 were performed by the quite same method as that of Example 1.

Next, as the etching resist, the dry etching using the mixed gas of oxygen and chlorine was performed in Example 1. However, in the present comparative example, the substrate was thrown into a dry etcher using the ECR plasma as the plasma source by means of the plasma of oxygen element for performing the dry etching of the liquid flow path constituting member 700. The etching conditions at this time were as follows. That is to say, the flow rate of oxygen was 100 sccm and the other conditions were the same as those in Example 1.

Figure 2B:
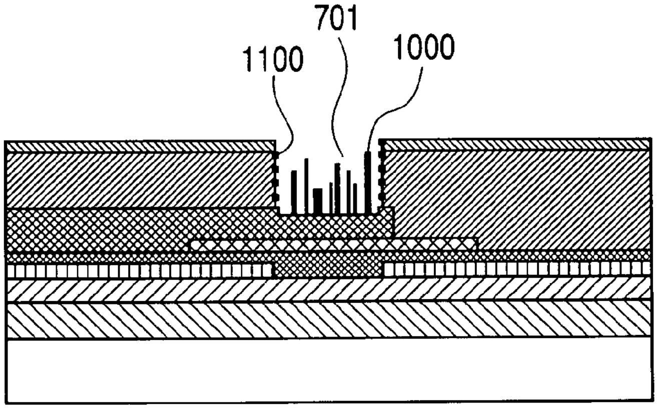

After the epoxy resin of the liquid flow path constituting member had been etched under such conditions, the shape of the nozzle (the discharge port 701), which had been etched, was observed with a SEM. Then, irregularities 1100 in the shape of stripes were found on the etched side wall, i.e. on the side wall of the discharge port, and the generation of columnar dregs 1000 was found on the shape material (the liquid flow path pattern). The state is shown in FIG. 2B.

Figure 2C:
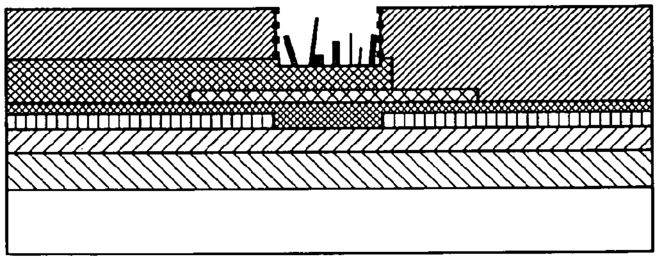

After that, the Si including resist was peeled off by a method similar to that in Example 1. The state is shown in FIG. 2C. The columnar dregs 1000 were damaged at the time of the peeling off of the Si including resist, and some of them were flown out together with the Si including resist. But they were not removed completely. Incidentally, the surface of the shape member (the liquid flow path pattern) 800 at the bottom end of the discharge port was slightly etched owing to the over etching at the time of the etching of the liquid flow path constituting member 700.

After that, the shape member (the liquid flow path pattern) in the liquid flow path was also removed by a method similar to that in Example 1 to form the liquid flow path 702. After that, the substrate was washed and dried. When the state was observed with the SEM, the columnar dregs were not completely removed, and parts of them were attached to the upper surface of the heater and on the liquid flow path as columnar dreg attachments 1001. The discharge port was in a state as shown in FIG. 2D.

Figure 2D:
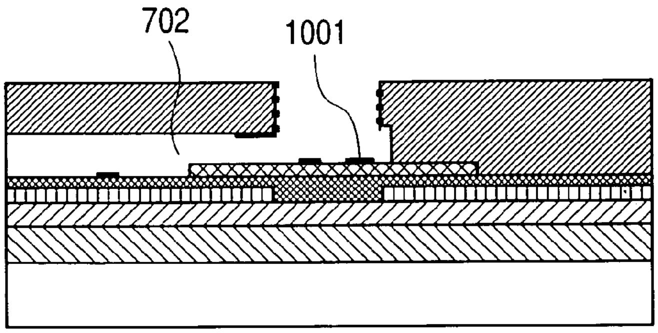

For performing a discharge test, the substrate forming the discharge port shown in FIG. 2D was connected with a container storing discharging ink, i.e. the ink including pure water, diethylene glycol, isopropyl alcohol, lithium acetate and black dye food black 2 at a ratio of 79.4, 15, 3, 0.1 and 2.5, with a tube put between them. When a rectangular voltage having a peak voltage of 30 V and a frequency of 3 kHz was applied to the electrothermal conversion body for 10 μs, flying droplets were not discharged from a part of the discharge ports. By the analysis of the cause was performed by breaking up the substrate, it was found that such a phenomenon occurred because the columnar dregs obstructed the flow path. Moreover, puddles of bubbles of ink were observed in the liquid flow paths of some discharge ports even in the discharge ports through which the ink could be discharged. Moreover, when the results were compared with those of Example 1, the discharge speed, the refilling speed and the ink drop discharge method were very unstable.

COMPARATIVE EXAMPLE 2

Figure 3A:
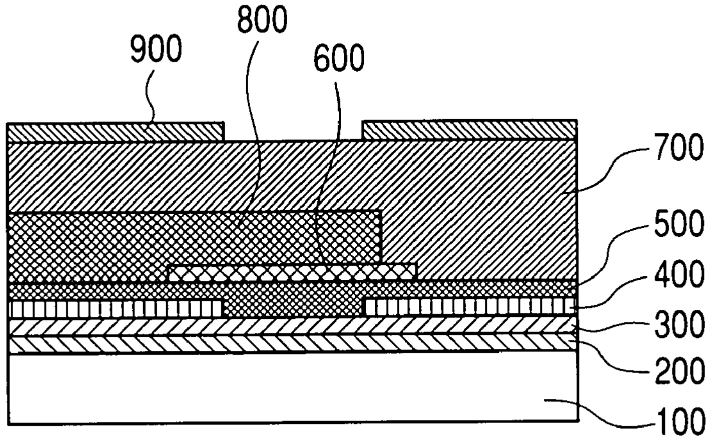
FIGS. 3A, 3B, 3C and 3D are sectional views showing the processes of a manufacturing method in case of forming the discharge port of an ink jet recording head by using mixed plasma of oxygen and fluorine.

As shown in FIG. 3A, the processes from the formation of the liquid flow path constituting member 700 on the substrate 100 to the formation of the mask pattern of the Si including resist 900 were performed by quite the same method as that of Example 1.

Next, as the etching resist, the dry etching using the mixed gas of oxygen and chlorine was performed in Example 1. However, in the present comparative example, the substrate was thrown into a dry etcher using the ECR plasma as the plasma source by means of a mixed gas of oxygen and fluorine for performing the dry etching of the liquid flow path constituting member 700. The etching conditions at this time were as follows. That is to say, the flow rates of oxygen and fluorine were 50 sccm and 50 sccm, respectively, and the other conditions were the same as those in Example 1.

Figure 3B:
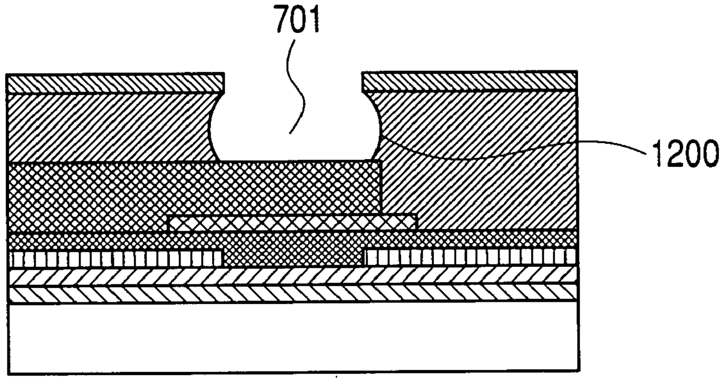

After the epoxy resin of the liquid flow path constituting member had been etched under such conditions, the shape of the nozzle (the discharge port 701), which had been etched, was observed with a SEM. Then, it was found that the etching side wall was shaped in a recessed shape 1200. The state is shown in FIG. 3B.

Figure 3C:
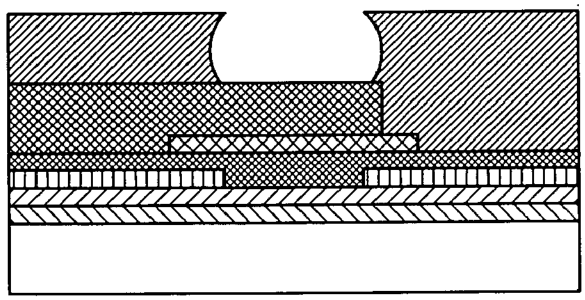

After that, the Si including resist was peeled off by a method similar to that in Example 1. The state is shown in FIG. 3C. After that, the shape member (the liquid flow path pattern) in the liquid flow path was also removed by a method similar to that in Example 1 to form the liquid flow path 702. After that, the substrate was washed and dried. Then, the discharge port was in a state as shown in FIG. 3D.

Figure 3D:
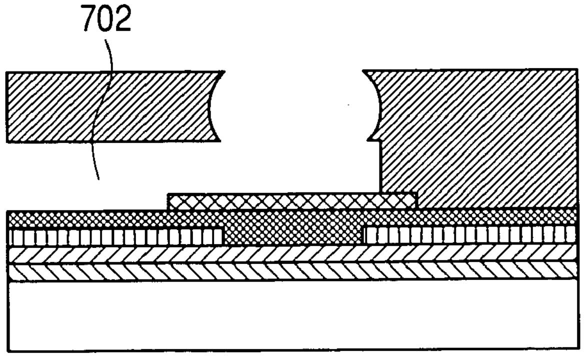

For performing a discharge test, the substrate forming the discharge port shown in FIG. 3D was connected with a container storing discharging ink, i.e. the ink including pure water, diethylene glycol, isopropyl alcohol, lithium acetate and black dye food black 2 at a ratio of 79.4, 15, 3, 0.1 and 2.5, with a tube put between them. When a rectangular voltage having a peak voltage of 30 V and a frequency of 3 kHz was applied to the electrothermal conversion body for 10 μs, the discharge directions of flying droplets were dispersed in comparison with the result of Example 1.

This application claims priority from Japanese Patent Application Nos. 2003-434523 filed on Dec. 26, 2003 and 2004-330630 filed on Nov. 15, 2004, which are hereby incorporated by reference herein.

What is claimed is:

1. A manufacturing method of an ink jet recording head including a discharge port for discharging ink, said method comprising:

providing a gas mixture comprising oxygen and chlorine;

providing a discharge port forming member for forming the discharge port, the discharge port forming member being made from a resin including a compound having Si atoms; and forming the discharge port by performing dry etching, using the gas mixture, on the discharge port forming member and removing a part of the discharge port forming member, wherein a mask pattern for forming the discharge port by performing the dry etching comprises a resist including Si atoms.

2. A manufacturing method of an ink jet recording head according to claim 1, wherein the discharge port forming member includes a flow path forming member forming an ink flow path and a water repellant member forming a discharge port surface, wherein said method further comprises a step of etching the water repellent member, and wherein a mixing ratio of chlorine employed in etching the water repellent member is higher than a mixing ratio of chlorine employed in etching the flow path forming member.

3. A manufacturing method of an ink jet recording head according to claim 1, wherein the discharge port forming member further comprises a silane coupling agent.

4. A manufacturing method of an ink jet recording head according to claim 1, said method further comprising:

a step of forming a liquid flow path pattern with a soluble resin;

a step of covering the liquid flow path pattern with a resin layer to be the discharge port forming member; and a step of eluting the liquid flow path pattern to form a liquid flow path after said step of forming the discharge port.

5. Manufacturing method of an ink jet recording head according to claim 4, further comprising a step of previously removing a periphery region of the resin layer to be the discharge port forming member on a substrate, the periphery region being a portion where a mask pattern used in the dry etching is not formed.

6. A manufacturing method of an ink jet recording head according to claim 4, wherein the discharge port forming member is integrally formed with the flow path forming member, in said step of covering the liquid flow path pattern with the resin layer to be the discharge port forming member, and wherein a dissolved material produced by dissolving the resin layer to be the discharge port forming member in a solvent is coated on the liquid flow path pattern, and then the resin layer for forming the discharge port forming member is cured.

7. A manufacturing method of an ink jet recording head including a flow path discharge port for discharging ink, said method comprising:

providing a gas mixture comprising oxygen and chlorine;

providing a flow path constituting member for forming the flow path and the discharge port, the flow path constituting member being made from a resin including a compound having Si atoms; and forming the discharge port by performing dry etching, using the gas mixture, on the flow path constituting member and removing a part of the flow path constituting member.

8. A manufacturing method of an ink jet recording head according to claim 7, wherein a mask pattern for forming the discharge port by performing the dry etching comprises a resist including Si atoms.

* * * * *